US012431642B2

(12) United States Patent
Vasbinder et al.

(10) Patent No.: US 12,431,642 B2
(45) Date of Patent: Sep. 30, 2025

(54) FLAT FLEXIBLE CABLE SEAL AND METHOD

(71) Applicant: TE Connectivity Solutions GmbH, Steinach (CH)

(72) Inventors: Andrew Jacob Vasbinder, Middletown, PA (US); Raghunandan Shrikanth Shanbhag, Bangalore (IN); Lindsey E. Gatesman, Winston Salem, NC (US); Hurley Chester Moll, Middletown, PA (US)

(73) Assignee: TE Connectivity Solutions GmbH (CH)

( * ) Notice: Subject to any disclaimer, the term of this patent is extended or adjusted under 35 U.S.C. 154(b) by 210 days.

(21) Appl. No.: 18/149,229

(22) Filed: Jan. 3, 2023

(65) Prior Publication Data

US 2024/0120670 A1 Apr. 11, 2024

(30) Foreign Application Priority Data

Oct. 10, 2022 (IN) .............................. 202241057795

(51) Int. Cl.
*H01R 12/61* (2011.01)
*H01R 12/65* (2011.01)
*H01R 12/79* (2011.01)
*H01R 13/504* (2006.01)
*H01R 13/52* (2006.01)

(52) U.S. Cl.
CPC ........... *H01R 12/613* (2013.01); *H01R 12/65* (2013.01); *H01R 12/79* (2013.01); *H01R 13/504* (2013.01); *H01R 13/5216* (2013.01)

(58) Field of Classification Search
CPC ...... H01R 12/613; H01R 12/65; H01R 12/79; H01R 13/504; H01R 13/5216; H01B 7/04; H01B 7/0823; H01B 7/28; H05K 2201/10189; H05K 2201/10295; H05K 1/189
See application file for complete search history.

(56) References Cited

U.S. PATENT DOCUMENTS

| 7,547,214 | B2 | 6/2009 | Duetsterhoeft et al. |
| 7,892,025 | B2 | 2/2011 | Daily et al. |
| 9,508,465 | B2 * | 11/2016 | Miura ........................ H05K 1/02 |
| 2020/0305296 | A1 * | 9/2020 | Tezuka ................. H05K 5/0034 |

FOREIGN PATENT DOCUMENTS

| DE | 102023202421 A1 * | 12/2023 | ........... H01R 12/771 |
| JP | 2013073888 A * | 4/2013 | |
| KR | 20130058066 A * | 6/2013 | |
| KR | 101430419 B1 * | 8/2014 | |

\* cited by examiner

*Primary Examiner* — Travis S Chambers

(57) ABSTRACT

A flat flexible cable assembly comprises a flat flexible cable including a plurality of conductors embedded within an insulation material, and a seal directly bonded to an exterior of the flat flexible cable continuously about its perimeter.

20 Claims, 5 Drawing Sheets

FLAT FLEXIBLE CABLE SEAL AND METHOD

CROSS-REFERENCE TO RELATED APPLICATIONS

This application claims the benefit of the filing date under 35 U.S.C. § 119(a)-(d) of Indian Patent Application No. 202241057795 filed Oct. 10, 2022.

FIELD OF THE INVENTION

The present invention relates to electrical connectors, and more particularly, to a seal for a flat flexible cable.

BACKGROUND

As understood by those skilled in the art, flat flexible cables (FFCs) or flat flexible circuits are electrical components consisting of at least one conductor (e.g., a metallic foil conductor) embedded within a thin, flexible strip of insulation. Flat flexible cables are gaining popularity across many industries due to advantages offered over their traditional "round wire" counter parts. Specifically, in addition to having a lower profile and lighter weight, FFCs enable the implementation of large circuit pathways with significantly greater ease compared to a round wire-based architectures. As a result, FFCs are being considered for many complex and/or high-volume applications, including wiring harnesses, such as those used in automotive manufacturing.

A critical obstacle preventing the implementation of FFCs into these applications includes the need to develop quick, robust, and low resistance termination techniques which enable an FFC to be mating with various components. Moreover, these applications often subject the FFCs and their associated connectors to harsh environmental contaminants, such as dirt and moisture. Accordingly, reliably terminating the FFCs includes sealing their connectors from these elements. However, reliably creating a seal about an FFC, as well as sealing the mating connectors associated therewith, has proven challenging.

Accordingly, cost effective and reliable solutions for connectorizing and sealing FFC assemblies are desired.

SUMMARY

In one embodiment of the present disclosure, a flat flexible cable assembly comprises a flat flexible cable including a plurality of conductors embedded within an insulation material, and a seal bonded directly around an exterior perimeter of the insulation material of the flat flexible cable.

BRIEF DESCRIPTION OF THE DRAWINGS

The invention will now be described by way of example with reference to the accompanying Figures, of which.

DETAILED DESCRIPTION OF THE EMBODIMENTS

Figure 1:
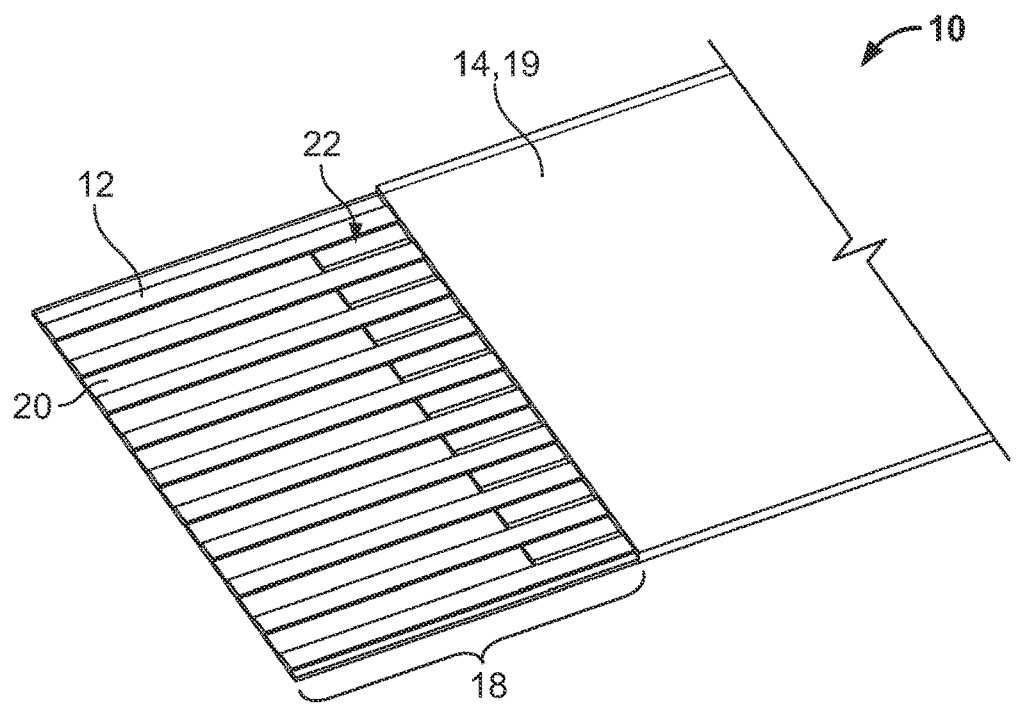
FIG. 1 is a perspective view of an exemplary FFC cable useful for describing embodiments of the present disclosure.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiments of the present disclosure include a seal for a flat flexible cable (FFC) or flat printed cable (FPC), a cable assembly including said seal, and a method of manufacturing the same. An exemplary FFC includes a plurality of conductors embedded within an insulation material. A seal is bonded directly or indirectly to an exterior surface of the insulation material via a low-pressure overmolding process. During overmolding, a low pressure heated molding material of the seal itself, or an associated seal support element, forms a bond with the exterior surface of the cable or circuit (i.e., its insulation material). In embodiments, the FFC may define one or more opening formed therethrough in an area to be covered by the seal. During manufacturing, the molding material of the seal or seal support flows through the opening(s). This arrangement increases the mechanical stability and/or fixation of the seal or seal support to the FFC, as well as provides integrated strain relief to the cable. Directly overmolding the seal or seal support to the cable provide several improvements over the current state of the art, including shorter production times, improved durability, and reduced cost.

A cable assembly according to an embodiment of the present disclosure includes a housing defining a receptacle receiving a free end of the FFC and the seal, as well as a cover selectively arranged over an opening of the receptacle and enclosing the seal therein. The seal abuts an internal wall of the receptacle about its periphery for sealing terminals attached to the FFC, and arranged within the receptacle, from an external environment. The cover further defines a slotted opening receiving the FFC therethrough.

Figure 8:
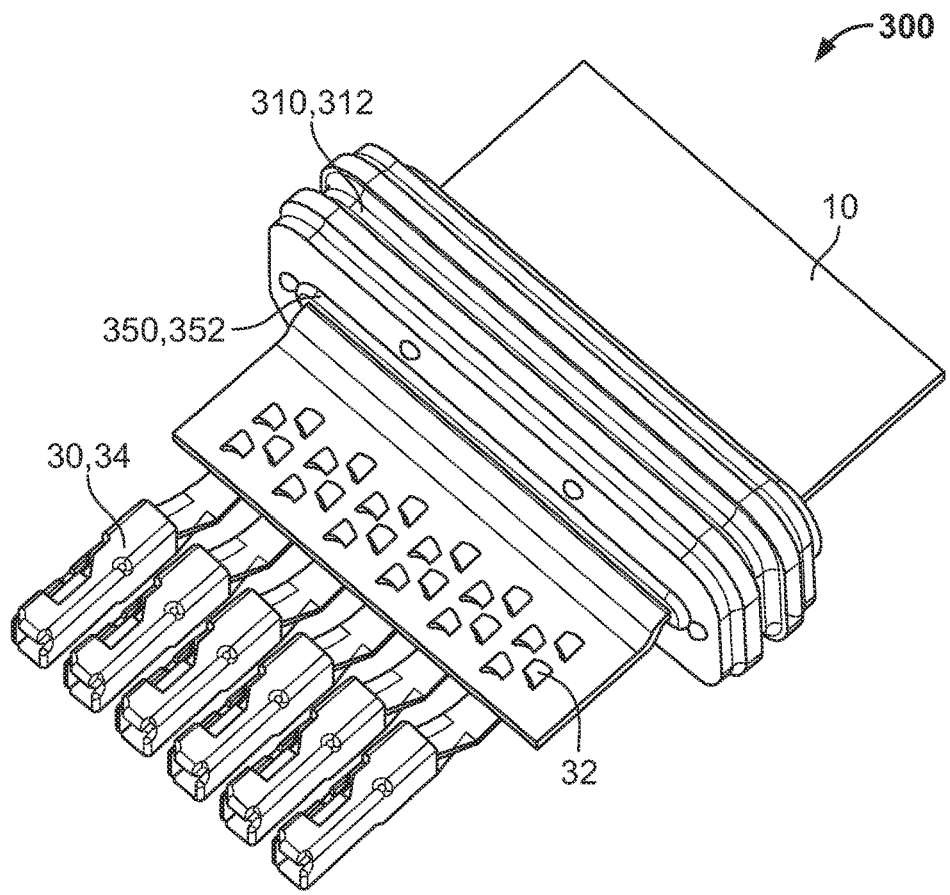
FIG. 8 is a top perspective view of a cable assembly including the FFC and seal assembly of FIGS. 6 and 7.
Figure 9:
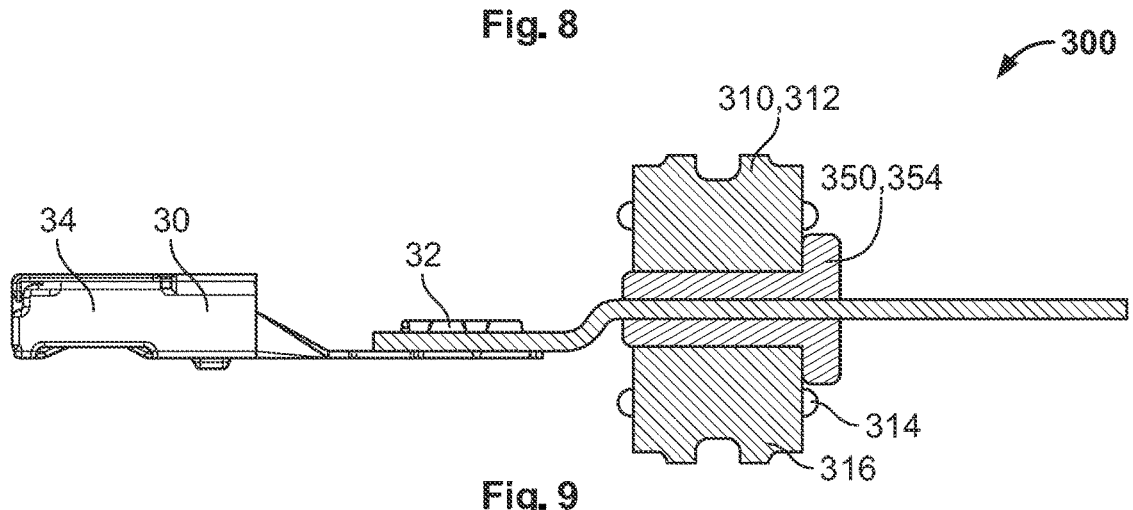
FIG. 9 is a cross-sectional view of the cable assembly of FIG. 8.

FIG. 1 illustrates an exemplary portion (i.e., an end segment) of an FFC 10. The exemplary FFC 10 includes a plurality of conductors 12 embedded within an insulation material 14. The conductors 12 may comprise metallic sheet or foil, such as copper foil, by way of example only, patterned in any desirable configuration. The insulation material 14, such as a polymer insulation material, may be applied to either side of the conductors 12 via an adhesive, resulting in an embedded conductor arrangement. One or more portions or windows of the insulation material may be removed (or may not be initially applied) in select areas to expose sections of the otherwise embedded conductors 12. In the exemplary embodiment, a portion of a top surface 19 of the insulation material 14 has been removed to define a single continuous window 18 exposing the ends of each of the conductors 12 on a top side thereof, while a bottom portion 20 of the insulation material 14 remains present for added stability and strength. A plurality of openings 22 are formed through the FFC 10 between each pair of adjacent conductors 12. In one embodiment, the openings 22 may be sized and positioned to receive locking clips or latches of electrical terminals (e.g., terminals 3, as shown in FIGS. 8 and 9) to be attached to the FFC 10 and/or to permit molding and/or adhesive material to flow therethrough during a seal formation process, as will be set forth in detail herein.

Figure 2:
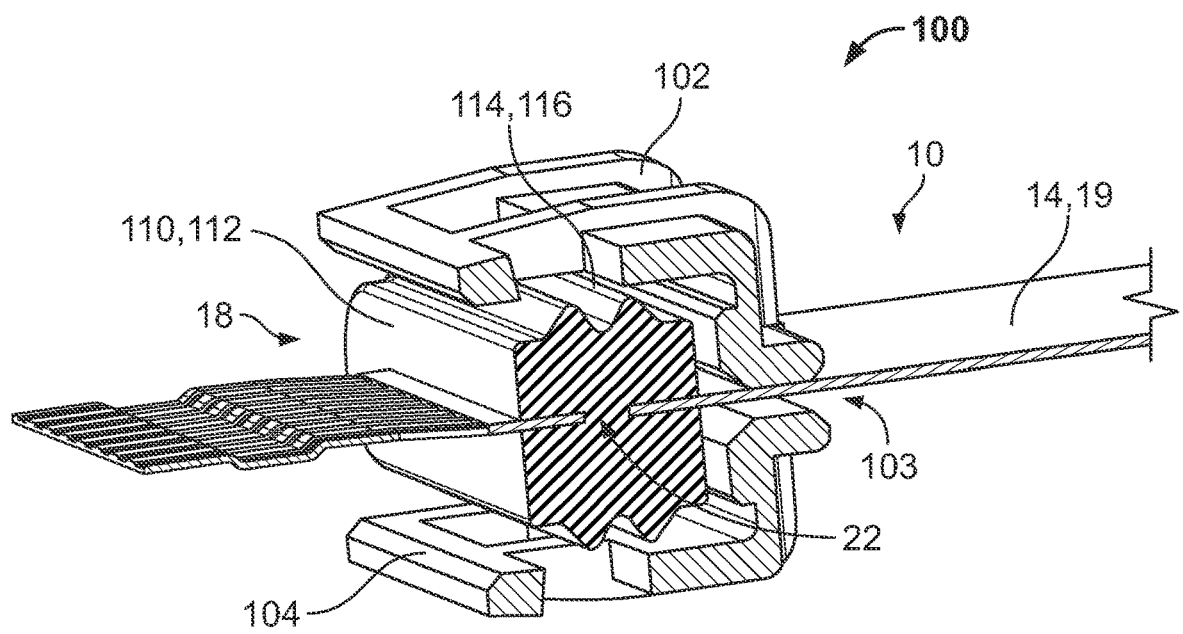
FIG. 2 is a cross-sectional view of an FFC assembly and a portion of a connector assembly according to an embodiment of the present disclosure.
Figure 3:
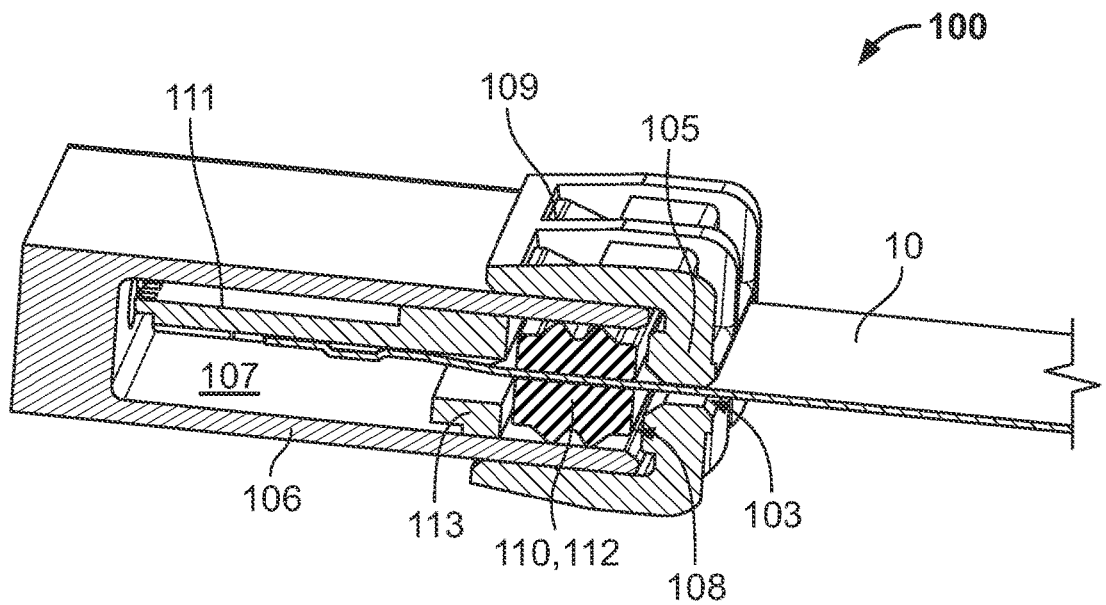
FIG. 3 is a cross-sectional view of the FFC assembly and the connector assembly of FIG. 2.

Referring to FIGS. 2 and 3, an FFC assembly 100 according to an embodiment of the present disclosure includes an FFC (e.g., the FFC 10 of FIG. 1), as well as a seal or seal element attached hereto. Specifically, in the embodiment of FIGS. 2 and 3, the seal comprises a monolithic seal element 110 bonded directly to an outer surface of the insulation material 14 of the FFC 10. In the exemplary embodiment, the seal 110 comprises a flexible polymer material (e.g., silicon) having a relatively low shore durometer (e.g., 70-85 A), with a melting temperature of around 200-220 degrees C. The seal 110 is formed directly onto the insulation material 14 of the FFC 10 via a low pressure, hot melt overmolding process. In some embodiments, the temperature is sufficient to melt the insulation material 14 and the base material of the molded seal together, creating an integral seal/insulation arrangement having improved mechanical strength, stability, and sealing properties.

As shown in FIG. 2, the FFC 10 includes the above-described openings 22 formed therethrough in the position of the seal 110. As a result, the seal material flows through the openings 22 during the overmolding process. This arrangement provides improved strain relief to the FFC, as well as stability and strength to the seal/FFC joint. In other embodiments, the seal 110 may be bonded to the FFC 10 via an adhesive, by way of example. In either embodiment, the seal 110 defines a monolithic body 112 which includes one or more sealing ribs 114 extending about an exterior perimeter thereof. In the exemplary embodiment, each sealing rib 114 tapers in a radially outward direction for defining a sealing surface or tip 116.

Still referring to FIG. 2, the assembly 100 according to embodiments of the present disclosure includes a cover 102, which may comprise a monolithic, polymer (e.g., plastic) element formed via a molding process. The exemplary cover 102 defines at least one elastic latch 104 extending in a mating direction for engaging with a corresponding catch formed on a connector housing, as shown in FIG. 3. The latch 104 is operative to selectively fix the cover 102 onto the connector housing. The cover 102 further defines a slotted opening 103 on a front end thereof that is sized to receive the FFC 10 therethrough.

Referring now to FIG. 3, a connector housing 106 according to an embodiment of the present disclosure is shown with the cover 102 selectively affixed over an open front end 108 thereof. Specifically, the latches 104 of the cover 102 engage with corresponding catches 109 (e.g., four catches) formed on an exterior surface of the housing 106. The seal 110 and free end of the FFC 10 are received within a receptacle or terminal space 107 defined within the housing 106. The sealing ribs 114 of the seal 110 abut or sealingly engage with an interior wall defining the receptable 107 about its perimeter. More specifically, the seal 110 is arranged within a front of the receptacle 107 directly adjacent to the open front end 108. The seal 110 is arranged between a front wall 105 of the cover 102, and an internal stop surface 113 protruding into the receptacle 107. In this way, terminals (see terminals 30 in FIGS. 8 and 9) of the assembly 100 may be sealed from an external environment within the receptacle 107, and thus from moisture, debris, etc., improving the reliability of the electrical connections established with the FFC 10. In the exemplary embodiment, one or more electrical components 111 (e.g., PCBs, processors, etc.) are arranged within the receptacle 107 and establish electrical contact with the terminated conductors of the FFC 10.

Figure 4:
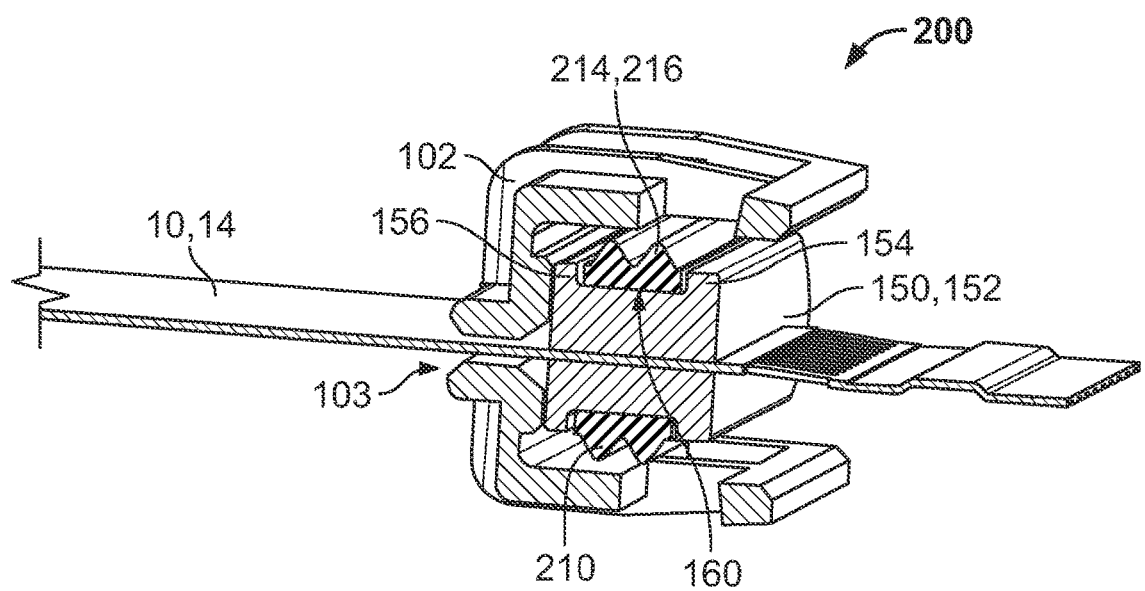
FIG. 4 is a cross-sectional view of an FFC assembly and a portion of a connector assembly according to an embodiment of the present disclosure.
Figure 5:
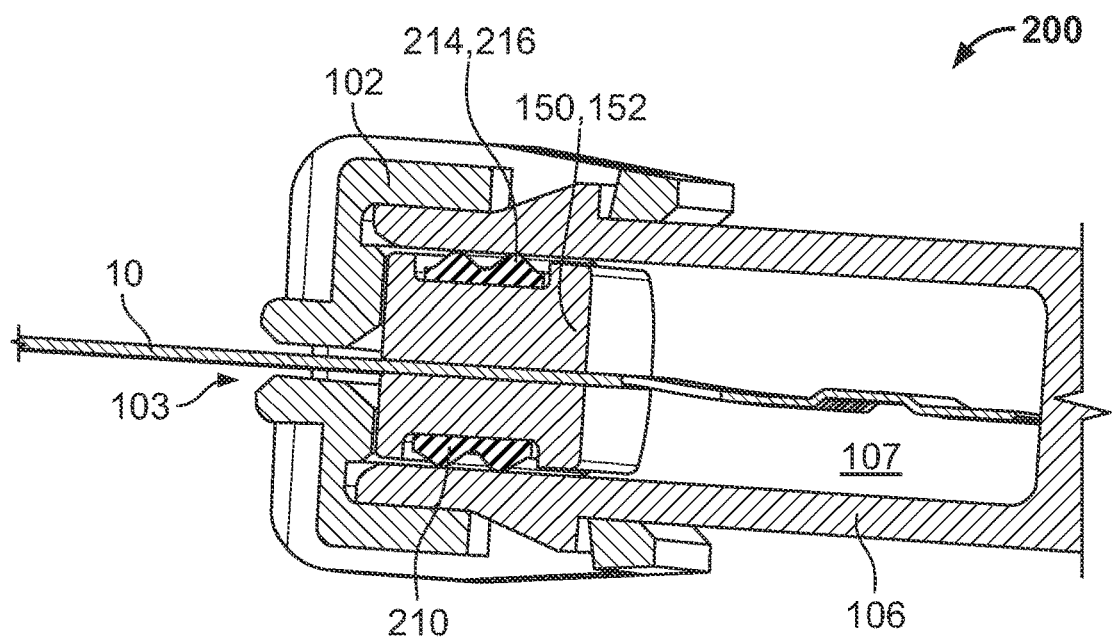
FIG. 5 is a cross-sectional view of the FFC assembly and the connector assembly of FIG. 4.
Figure 6:
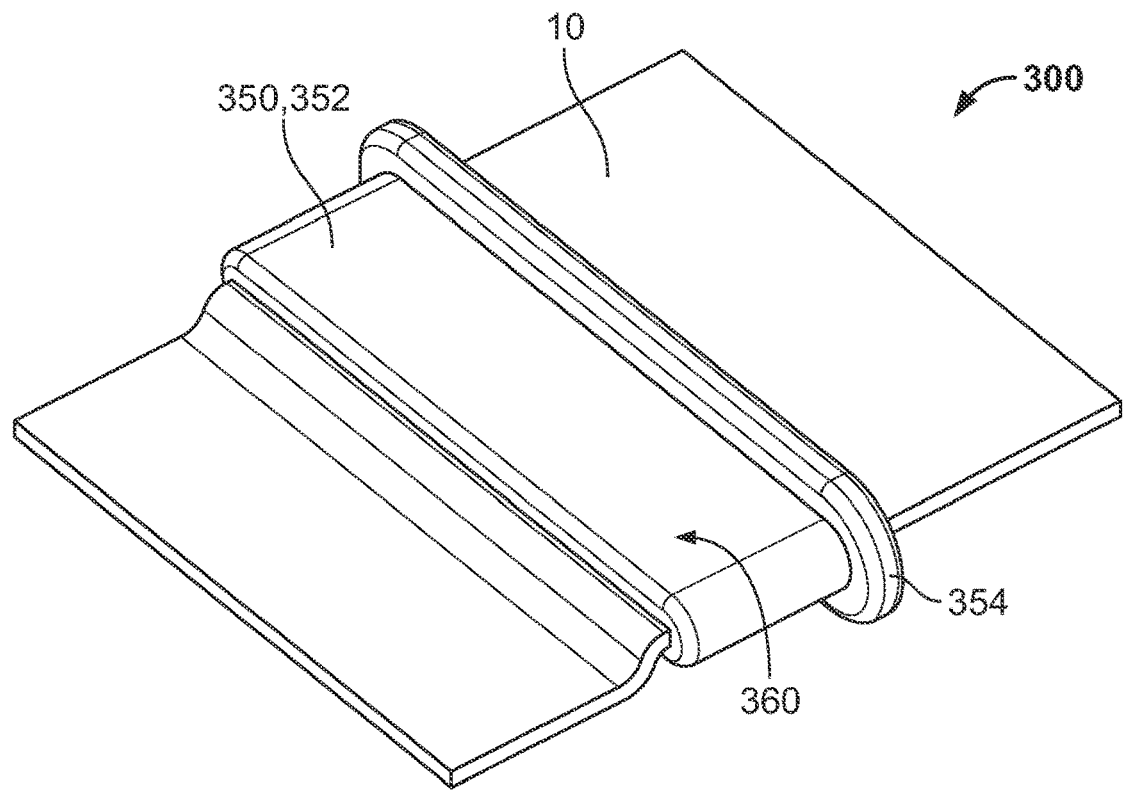
FIG. 6 is a perspective view of an FFC and a portion of a seal or seal assembly according to an embodiment of the present disclosure.
Figure 7:
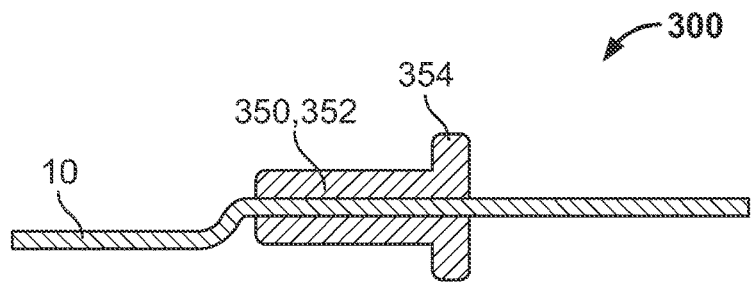
FIG. 7 is side cross-sectional view of the embodiment of FIG. 6.

Referring now to FIGS. 4 and 5, according to another embodiment of the present disclosure, an FFC assembly 200 includes a seal or seal assembly having both a flexible sealing element or seal 210 (e.g., a monolithic silicon or rubber seal), as well as a seal support 150. Like the seal 110 described above, the seal support 150 comprises a polymer body 152 bonded directly to the exterior of the FFC 10 via hot-melt overmolding, or via an adhesive, by way of example. The material of the seal support 150 may be the same, or different from, that of the seals 110,210. As with the embodiment of FIGS. 2 and 3, the body 152 of the seal support 150 may extend through openings formed through the FFC 10, increasing the strength of the bond, as well as provide strain relief for the cable 10 in general, and/or may be melted with the insulation material 14 of the FFC 10 to form an integral piece.

The body 152 of the seal support 150 defines two flanges 154,156 on opposite ends thereof. The flanges 154,156 define a recess 160 therebetween sized to receive the seal 210. The flanges 154,156 are operative to secure the seal 210 relative to the seal support 150, and prevent its inadvertent movement in an axial direction as it is inserted into the receptacle of the housing 106, as shown in FIG. 5. The seal 210 may comprise a discrete, separable element from the seal support 150 may also be directly overmolded or otherwise bonded (e.g., via an adhesive) to the seal support and into the recess 160 without departing from the scope of the present disclosure. As with the seal 110, the sealing element or seal 210 comprises a plurality of sealing ribs 214 arranged about its perimeter. Each sealing rib 214 tapers in a radially-outward direction to a sealing surface or tip 216. Advantageously, as the seal 210 is separate from the seal support 150 bonded to the FFC, the seal may be replaceable in the case of wear or damage. Moreover, the seal support 150 may be adapted to accommodate a preexisting seal, such that the design and manufacture of a new seal may be avoided. The embodiments of FIGS. 4 and 5 utilize the same, or a substantially similar, cover 102 and housing 106 as that set forth above with respect to embodiment of FIGS. 2 and 3.

With reference now to FIGS. 6-9, another FFC assembly 300 according to the present disclosure includes a seal support 350 having a body 352 defining a single seal retaining flange 354. The flange 354 is positioned on a side of the seal support 350 opposite to a free end of the FFC 10. In this way, the flange 354 will retain a seal as it is inserted into a connector housing, such as the housing 106 shown in the preceding embodiments. As with the above-described embodiments, the seal support 350 may be formed on or bonded directly to the FFC 10 via adhesive or an overmolding operation, by way of non-limiting example.

As shown in FIGS. 8 and 9, a seal 310 mountable to the seal support 350 includes a body 213 defining a plurality of sealing ribs 316 extending radially therefrom. The seal 310 may be adhered or bonded to, or merely friction-fit over, the seal support 350. The body 312 of the seal 310 further defines protrusions 314 extending therefrom in an axial direction, or longitudinal direction of the FFC 10. The protrusions 314 may engage with, for example, complementary recesses formed on a housing and/or cover of a connector into which the assembly 300 is installed in order to aid in proper alignment and/or improved mechanical stability of the assembly. In other embodiments, recesses may be formed in these surfaces of the body 312, with the housing and/or cover defining the protruding surfaces.

In the exemplary embodiment, a plurality of terminals 30 are fixed to a free end of the FFC 10. More specifically, each terminal 30 is secured (e.g., via crimping) to an end of a respective conductor embedded within the FFC 10. In the exemplary embodiment, each terminal 30 comprises an insulation displacement contact (IDC) having foldable, sharpened tines 32 sized and positioned to penetrate the insulation material of the FFC 10, and establish electrical contact with the conductors embedded therein. A receiving end 34 of each terminal 30 is adapted to receive a conductor (e.g., an elongated pin) of a mating connector or terminal, by way of non-limiting example. The terminals 30 may be fitted to each of the preceding embodiments of FIGS. 1-5 in a like manner.

Figure 10:
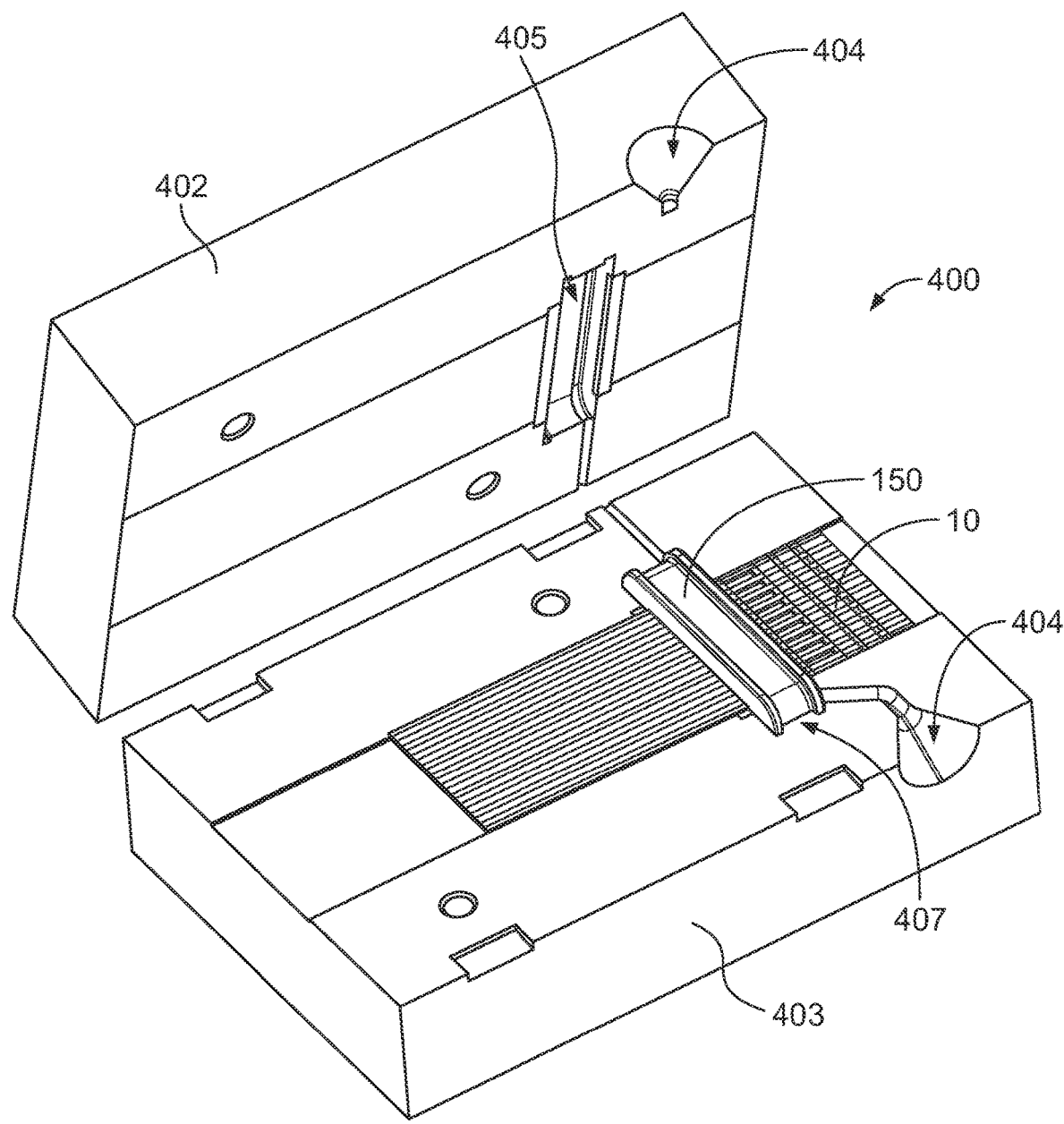
FIG. 10 is a perspective view of an exemplary injection mold for manufacturing embodiments of the present disclosure.

FIG. 10 illustrates an exemplary mold assembly 400 which may be used to manufacture an FFC cable assembly according to the embodiment of FIGS. 4 and 5, by way of non-limiting example only. The assembly 400 generally includes first and second mold halves 402,403 each having an injection cavity 405,407 corresponding to the seal support 150 (or to the seal or seal supports 110,300,350) to be overmolded onto the insulation material of the FFC 10. With the mold halves 402,403 in a closed position (not shown), a base material to be molded onto the FFC 10 is introduced into the cavities 405,407 via a channel 404 in communication therewith. As set forth above, this process is cost effective, efficient, and results in a cable assembly having improved mechanical properties compared to arrangements of the prior art.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A flat flexible cable assembly, comprising:
    a flat flexible cable including a plurality of conductors embedded within an insulation material; and
    a seal arranged circumferentially about the flat flexible cable and forming a continuous seal with an exterior surface of the flat flexible cable, the seal including:
        a seal support bonded to the exterior surface of the flat flexible cable, the seal support defining a molded plastic body overmolded onto the insulation material of the flat flexible cable; and
        a flexible sealing element arranged about a perimeter of the seal support.

2. The assembly of claim 1, wherein the seal support defines a sealing element recess formed therein for retaining the sealing element.

3. The assembly of claim 2, wherein the sealing element recess is defined between two radially outward extending flanges of the seal support.

4. A connector assembly, comprising:
    a flat flexible cable having a plurality of conductors embedded within an insulation material; and
    a connector, including:
        a housing defining a receptacle for receiving the flat flexible cable;
        a seal arranged circumferentially about the flat flexible cable and forming a continuous seal with an exterior surface thereof, the seal engaging with the housing proximate an open end of the receptacle;
        a cover defining an opening receiving the flat flexible cable therethrough, the cover selectively secured over the open end of the receptacle of the housing; and
        a plurality of conductive terminals arranged within the receptacle and electrically connected to the plurality of conductors.

5. The assembly of claim 4, wherein the seal comprises a flexible polymer element overmolded directly onto the exterior surface of the flat flexible cable.

6. The assembly of claim 5, wherein the flat flexible cable includes a plurality of openings defined through the insulation material, the seal molded through the openings.

7. The assembly of claim 4, wherein the seal comprises a body defining a plurality of sealing ribs formed about an outer perimeter of the seal and extending in a radially outward direction.

8. The assembly of claim 4, wherein the seal includes:
    a seal support bonded to the exterior surface of the flat flexible cable; and
    a flexible sealing element arranged continuously about a perimeter of the seal support.

9. The assembly of claim 8, wherein the seal support defines a sealing element recess therein for retaining the sealing element.

10. The assembly of claim 9, wherein the sealing element recess is defined between two radially extending flanges of the seal support.

11. The assembly of claim 8, wherein the seal support includes a polymer body directly fixed to the flat flexible cable.

12. The assembly of claim 11, wherein the seal support is overmolded onto the exterior of the flat flexible cable.

13. The assembly of claim 1, further comprising a connector, including:
   a housing defining a receptacle receiving the flat flexible cable, the seal engaging with the housing proximate an open end of the receptacle; and
   a cover defining an opening receiving the flat flexible cable therethrough, the cover selectively secured over the open end of the receptacle of the housing and securing the seal within the receptacle.

14. The assembly of claim 13, wherein the connector further includes a plurality of conductive terminals arranged within the receptacle and electrically connected to the plurality of conductors of the flat flexible cable.

15. The assembly of claim 13, wherein the cover is fitted over a free end of the housing defining the open end of the receptacle.

16. The assembly of claim 15, wherein an internal surface of the free end of the housing defining the receptacle engages with the seal about a periphery of the receptacle.

17. The assembly of claim 16, wherein the at least a portion of the free end of the cover is arranged between the seal and a latch of the cover.

18. The assembly of claim 17, wherein the latch of the cover engages with a corresponding catch formed on an exterior of the housing.

19. The assembly of claim 18, wherein cover latches to at least two sides of the housing.

20. The assembly of claim 16, wherein the cover directly opposes the seal in a direction of fitting of the cover over the free end of the housing.

* * * * *